United States Patent
Nakatsuka et al.

(10) Patent No.: US 9,934,834 B2
(45) Date of Patent: Apr. 3, 2018

(54) MAGNETORESISTIVE MEMORY DEVICE

(71) Applicant: TOSHIBA MEMORY CORPORATION, Minato-ku, Tokyo (JP)

(72) Inventors: Keisuke Nakatsuka, Seoul (KR); Katsuhiko Hoya, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/248,247

(22) Filed: Aug. 26, 2016

(65) Prior Publication Data

US 2016/0365132 A1 Dec. 15, 2016

Related U.S. Application Data

(63) Continuation of application No. PCT/JP2014/063399, filed on May 14, 2014.

(60) Provisional application No. 61/946,198, filed on Feb. 28, 2014.

(51) Int. Cl.
*G11C 11/44* (2006.01)
*G11C 11/16* (2006.01)

(52) U.S. Cl.
CPC ........ *G11C 11/1673* (2013.01); *G11C 11/161* (2013.01); *G11C 11/1655* (2013.01); *G11C 11/1659* (2013.01); *G11C 11/1675* (2013.01); *G11C 11/1697* (2013.01)

(58) Field of Classification Search
None
See application file for complete search history.

(56) References Cited

U.S. PATENT DOCUMENTS

| | | | |
|---|---|---|---|
| 2011/0170338 A1 | 7/2011 | Kim et al. | |
| 2013/0028011 A1* | 1/2013 | Kitagawa | G11C 11/161 365/158 |
| 2013/0088911 A1 | 4/2013 | Nakura et al. | |
| 2014/0043892 A1* | 2/2014 | Lee | G11C 11/16 365/158 |
| 2014/0340959 A1* | 11/2014 | Antonyan | G11C 11/1675 365/158 |

FOREIGN PATENT DOCUMENTS

WO 2007111319 A1 10/2007

OTHER PUBLICATIONS

International Search Report (ISR) and Written Opinion dated Jul. 15, 2014 issued in International Application No. PCT/JP2014/063399.

(Continued)

*Primary Examiner* — Uyen B Tran
(74) *Attorney, Agent, or Firm* — Holtz, Holtz & Volek PC

(57) ABSTRACT

A magnetoresistive memory device includes a variable resistance element and a read circuit. The resistance element has a resistance state, which is one of switchable first and second resistance states. The first and second resistance states exhibit different resistances. Each of the first and second resistance states is reached by a current flowing through the variable resistance element in one of opposing first and second directions. The read circuit passes a read current through the variable resistance element autonomously in the first or second direction in accordance with the resistance state of the variable resistance element.

20 Claims, 7 Drawing Sheets

(56) References Cited

OTHER PUBLICATIONS

International Preliminary Report on Patentability (IPRP) including Written Opinion (in English) dated Sep. 15, 2016, issued in counterpart International Application No. PCT/JP2014/063399.

* cited by examiner

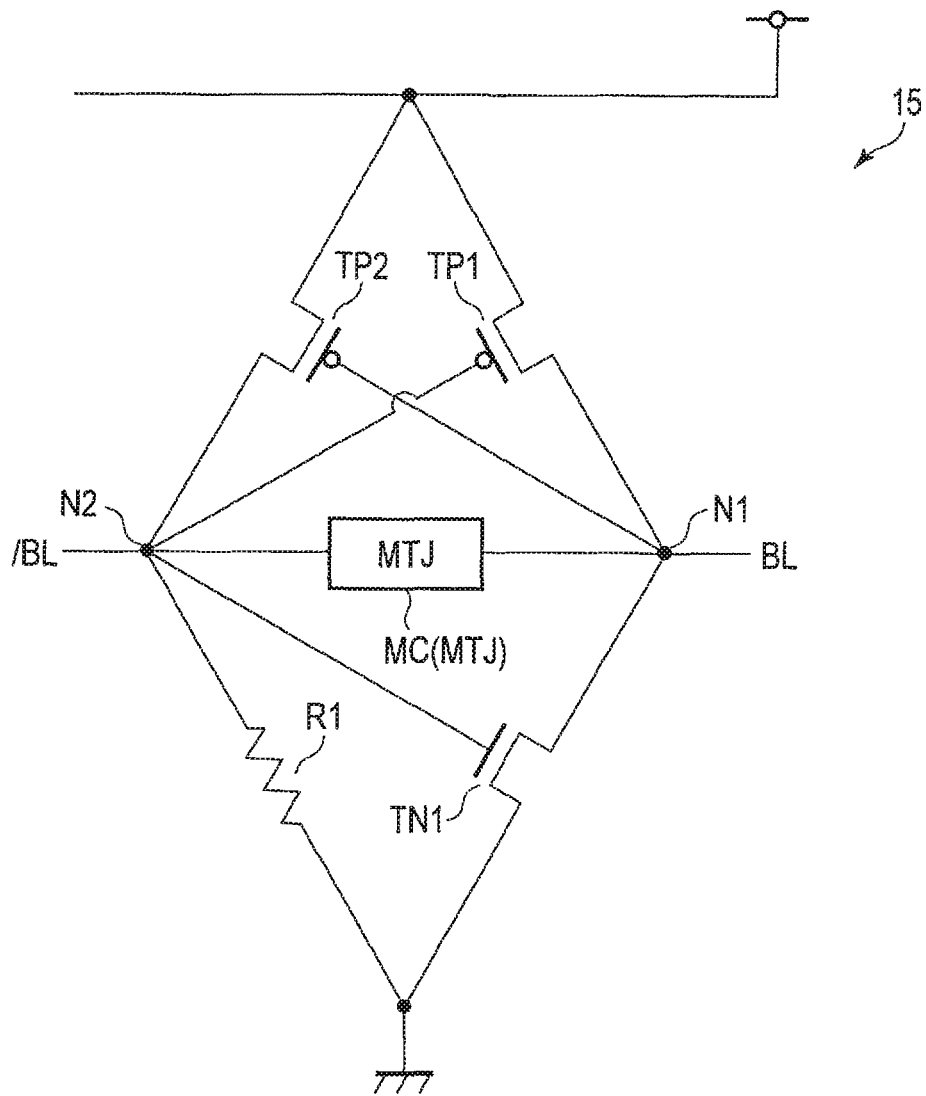
F I G. 7

MAGNETORESISTIVE MEMORY DEVICE

CROSS-REFERENCE TO RELATED APPLICATIONS

This application is a Continuation Application of PCT Application No. PCT/JP2014/063399, filed May 14, 2014 and based upon and claiming the benefit of U.S. Provisional Application No. 61/946,198, filed Feb. 28, 2014, the entire contents of which are incorporated herein by reference.

FIELD

Embodiments described herein relate generally to magnetoresistive memory devices.

BACKGROUND

In recent years, various new memories have been proposed as alternative memories for a flash memory or a dynamic random access memory (DRAM). Such memories include a magnetoresistive RAM (MRAM). The MRAM, among new memories, can operate at high speed and can be shrunk relatively easily.

BRIEF DESCRIPTION OF THE DRAWINGS

FIG. 7 illustrates a circuit diagram of a read circuit of the first embodiment;

DETAILED DESCRIPTION

According to one embodiment, a magnetoresistive memory device includes a variable resistance element and a read circuit. The resistance element has a resistance state. The resistance state is one of switchable first and second resistance states The first and second resistance states exhibit different resistances. Each of the first and second resistance states is reached by a current flowing through the variable resistance element in one of opposing first and second directions. The read circuit passes a read current through the variable resistance element autonomously in the first or second direction in accordance with the resistance state of the variable resistance element.

The MRAM uses an element which exhibits a magneto magnetoresistive effect (MR) as memory cells. The term 'MR' refers to the exhibition of different resistances by an element in accordance with the state of magnetization. An MR element has two stable states, which exhibit two different resistances. The two states are determined dynamically by flow of a current Iw larger than a threshold Ic between two terminals of the MR element, and a single state is reached according to the direction of the current Iw. Assigning the two states (or, resistances) to respective two values allows an MR element to store 1-bit information.

Figure 1:
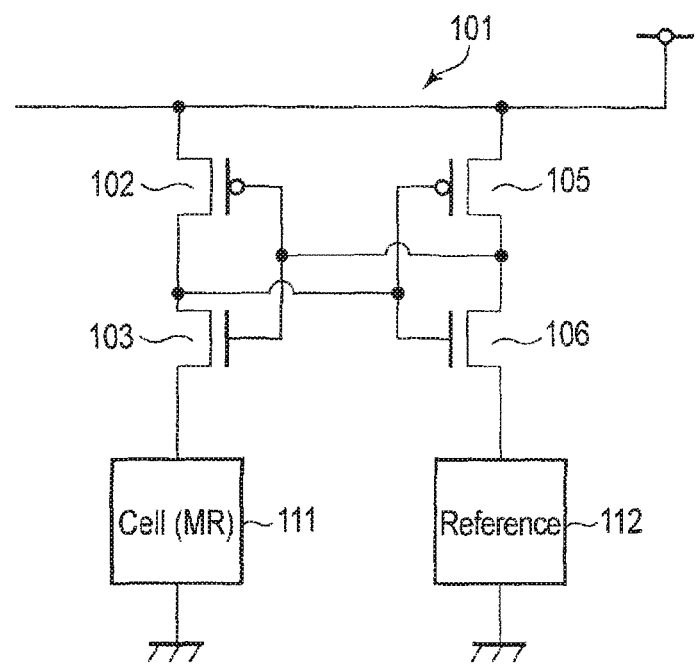
FIG. 1 illustrates a circuit diagram of a conventional sense amplifier.

In order for the resistance state of an MR element to be distinguished, a fixed voltage is applied to the both ends of the MR element, and the value of the resultant current Ir flowing through the MR element is measured. This read current Ir is compared with a reference by a sense amplifier, and the difference between the current Ir and reference is amplified. The sense amplifier 101 has components and connections illustrated, for example in FIG. 1. The sense amplifier 101 has two pairs of transistors. One of the pairs includes a p-type metal oxide semiconductor field effect transistor (MOSFET) 102 coupled serially between a power supply node and an n-type MOSFET 103. The other pair includes a p-type MOSFET 105 coupled serially between the power supply node and an n-type MOSFET 106. Respective gates of the transistors 102 and 103 are coupled to the connection node between the transistors 105 and 106. Respective gates of the transistors 105 and 106 are coupled to the connection node between the transistors 102 and 103. One pair is coupled to a read-target MR element 111 (or, memory cell), and the other pair is coupled to a cell 112 for reference. The reference cell 112 is used to generate a reference current. The state of the cell 111 is detected with a magnitude of a potential of the connection node of one or each of both of the transistor pairs.

The read current Ir may switch the resistance state of the read-target MR element depending on the combination of various conditions. The read current always flows in the same direction as can be seen from FIG. 1, and, if this direction is the same as that for switching the state of the read-target MR element, the state of the MR element may be switched. Such unintentional state reversal is referred to as read disturb.

Figure 2:
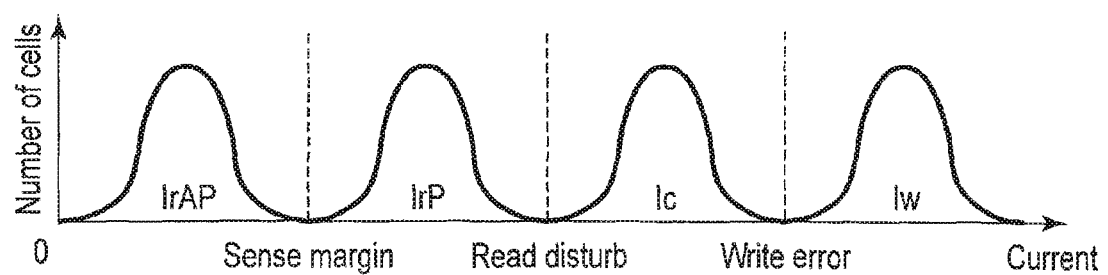
FIG. 2 illustrates distributions of various currents in a conventional MRAM.

The read disturb can be suppressed by making the read current Ir smaller than the threshold IC of the current which switches the state of the MR element. The magnitudes of the read currents Ir in respective two states, i.e., IrAP, IrP, and threshold current Ic are determined in accordance with the properties of the MR elements. It is ideal if all MR elements in the MRAM have uniform properties; however, in actuality they vary in properties. Therefore, the magnitudes of the currents IrAP, IrP, and Ic have distributions as illustrated in FIG. 2. The horizontal axis of FIG. 2 illustrates the magnitude of the current, and the vertical axis is the number of MR elements associated with the current IrAP, IrP, or Ic of a corresponding magnitude. In order to avoid the read disturb, the properties of the MR elements are determined so that the end of the distribution of the current IrP and that of the current Ic do not overlap.

FIG. 2 also illustrates the distribution of the write current Iw. The write current Iw may also vary in the MR elements. Avoiding the overlap of the ends of the distribution of the write current Iw and threshold current Ic can avoid write errors caused by shortage of the write current Iw. Moreover, with the properties of a single bit observed, the write in an MR element has a probability distribution. The threshold current Ic is defined as a value with which the write probability is 50%. Flow of a current larger than the threshold current Ic results in a higher probability for write, and that smaller than the threshold current Ic results in a lower probability. In order to avoid the write errors and read disturb, the read and write currents Ir and Iw need to be determined with the property variation of bits as well as the probability distribution taken into consideration. Furthermore, the interval between the end of the distribution of read current IrAP and that of the read current IrP defines the margin sensing read data. Shortage of the margin may cause cases where the state of an MR element is not correctly determined.

The read disturb, shortage of sense margin, and write errors are better avoided by securing wide intervals between the current distributions. Shrinking an MRAM, however, reduces areas of the MR elements, various interconnects, and associated transistors, and raises the resistances of these components. This leads to reduction of the write current Iw realizable with a voltage of a particular magnitude; however, securing a large voltage for generating the current Iw is unacceptable due to demands to lower the power consumption, etc. Therefore, the current Iw needs to be small, which requires to squeeze the distributions of currents Ir, Ic, and Iw into a narrower range. Furthermore, reduction of dimensions of components enhances the variation in the currents Ir, Ic, and Iw, and widens the distributions of these currents. This, in turn, causes the MRAM to malfunction.

Embodiments will now be described with reference to the figures. In the following description, components with substantially the same functionality and configuration are labeled with the same sign, and a repeated description is made only when required. Moreover, the entire description for a particular embodiment also applies to another embodiment unless it is explicitly mentioned otherwise or obviously eliminated.

First Embodiment

Figure 3:
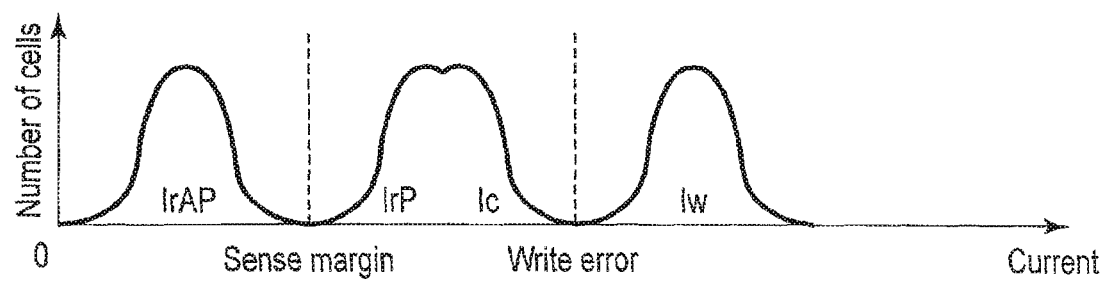
FIG. 3 illustrates distributions of various currents in a first embodiment.

In order to avoid the read disturb, shortage of sense margin, and write errors to implement normal operation of the MRAM, the intervals between adjacent current distributions need to be secured as described above. In contrast, the reduction of the current Iw makes it difficult to secure of the intervals between current distributions. The inventor of the present application realized that a reduced number of the intervals to be taken into consideration for normal operation can secure the interval between the current distributions and put the current distributions in a smaller range. The inventor of the present application then focused on the interval between the distributions of the currents Ic and IrP as a distribution interval which will be made unnecessary. If an MRAM which accepts an overlap of distributions of the currents Ic and IrP while operating normally is realized as illustrated in FIG. 3, such an MRAM can realize both reduction in size and normal operation. FIG. 3 illustrates distributions of various currents as in FIG. 2. The MRAM of the first embodiment is based on this conception.

Figure 4:
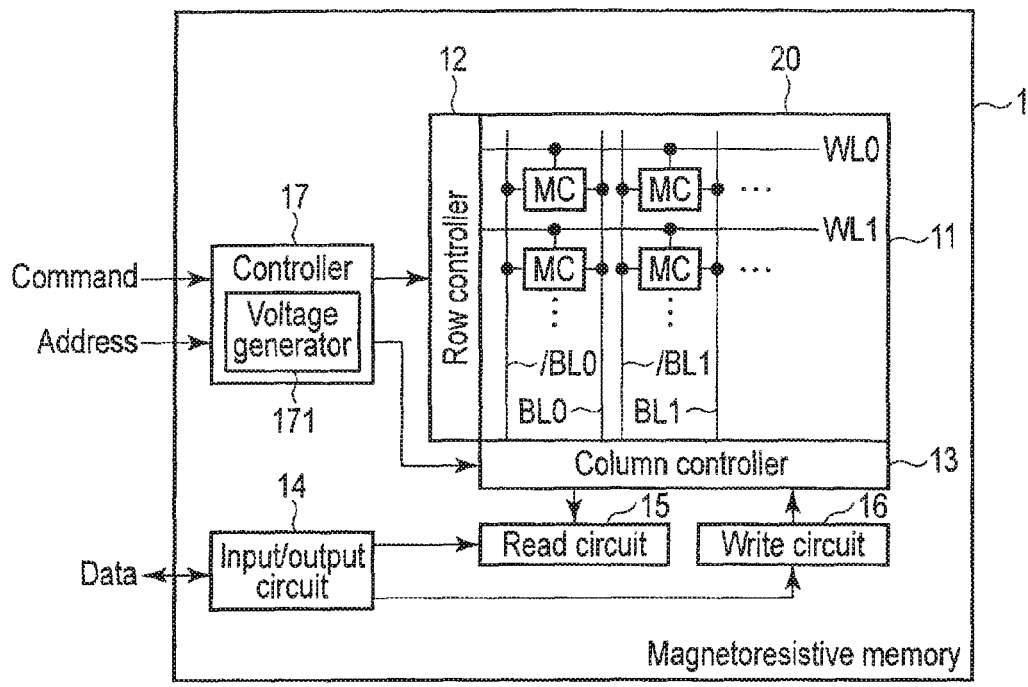
FIG. 4 is a block diagram of a magnetoresistive memory device of the first embodiment.

FIG. 4 is a block diagram of a magnetoresistive memory device of the first embodiment. The magnetoresistive memory device 1 is an MRAM, and MRAM1 includes a memory cell array 11, a row controller 12, a column controller 13, an input and output circuit 14, a read circuit 15, a write circuit 16, and a controller 17 as illustrated in FIG. 4. It is not necessary to distinguish each functional block as in the example of FIG. 4. For example, some of the functions may be executed by a functional block other than the illustrated functional block. An illustrated functional block may be divided into smaller functional sub-blocks.

The memory cell array 11 includes multiple memory cells MC. The memory cells MC are arranged at a matrix form, for example. The memory cell array MC is provided with multiple pairs of bit lines BL and /BL, and word lines WL. Each bit-line pair belongs to a single column, and each word line WL to a single row.

Figure 5:
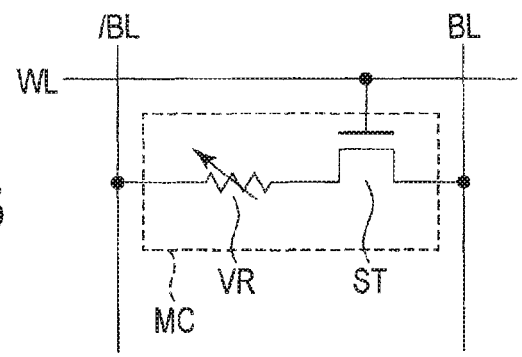
FIG. 5 is a circuit diagram of an example memory cell of the first embodiment.

A memory cell MC has components and connections as illustrated in FIG. 5. FIG. 5 is the circuit diagram of the memory cell of the first embodiment. As illustrated in FIG. 5, it includes a variable-resistance element VR and a select transistor ST. The variable-resistance element VR and select transistor ST are coupled in series between a single bit-line pair BL and /BL. The select transistor ST is made of an n-type metal oxide semiconductor field effect transistor, for example. The gate of the select transistor ST is coupled to a single word line WL. The variable-resistance element VR is made of a magnetoresistive-effect (MR) element, for example, and the MR element is made of, for example, a magnetic tunnel junction (MTJ) element.

Figure 6:
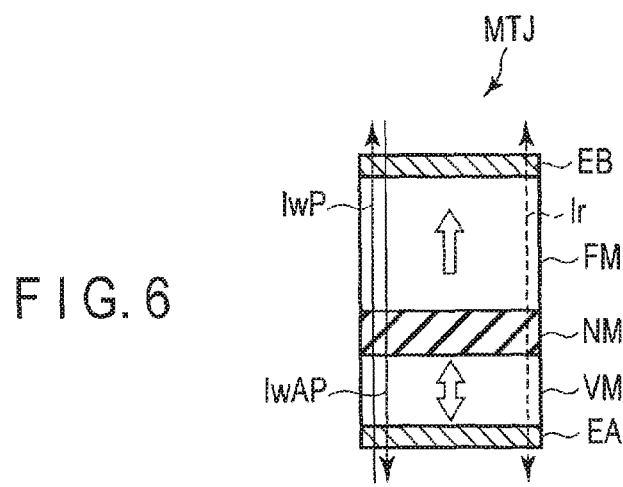
FIG. 6 illustrates a structure of an MTJ element of the first embodiment.

The element MTJ stores data in non-volatile manner in accordance with the state of magnetization. The element MTJ includes two magnetic layers FM and VM and a nonmagnetic layer NM therebetween as illustrated in FIG. 6. The magnetic layer FM has a fixed orientation of magnetization, and the magnetic layer VM has a magnetization with a variable orientation. The magnetic layers FM and VM have magnetization easy axes (illustrated by the arrow) along the direction which pierces through the interfaces of the layers FM, NM, and VM. The magnetic layers FM and VM may have magnetization easy axes along the interfaces of the layers FM, NM, and VM. The layers FM, NM, and VM are provided between electrodes EA and EB. When orientations of magnetization of the magnetic layers FM and VM are parallel and antiparallel, the element MTJ exhibits the minimum and maximum resistances, respectively. The states of the two different resistances are assigned to data of two values, respectively. For example, the parallel and antiparallel state of orientations of magnetization of the magnetic layers FM and VM are associated with the states where "0" and "1" bit are stored, respectively. A write current IwP flowing from the magnetic layer VM to the magnetic layer FM makes the orientations of magnetization of the magnetic layers FM and VM parallel. In contrast, flow of a write current IwAP from the magnetic layer FM to the magnetic layer VM makes the orientations of magnetization of the magnetic layers FM and VM antiparallel. Each of the currents IwP and IwAP is larger than the threshold Ic for the state of the element MTJ to be switched.

Referring back to FIG. 4, the controller 17 receives control signals, such as an address and a command, from the outside, and controls the row controller 12, column controller 13, read circuit 15, and write circuit 16 in accordance with the control signals. The row controller 12 is coupled to the word lines WL, receives a row address from the controller 17, and selects a single word line WL in accordance with the received row address. Respective select transistors ST of memory cells MC coupled to the selected word line WL are turned on.

The column controller 13 is coupled to pairs of bit-line BL and /BL, and receives a column address from the controller 17, and selects a single bit-line pair BL and /BL in accordance with the column address. The selected bit-line pair BL and /BL is coupled to the read circuit 15 or write circuit 16.

The read circuit 15 reads data stored in the selected memory cell MC to the input and output circuit 14 through a corresponding bit-line pair BL and /BL. To this end, the magnetoresistive memory device 1 includes a voltage generator 171, and the read circuit 15 applies voltages received from the voltage generator 171 to the bit line pairs BL and /BL. The voltage generator 171 is included in the controller 17, for example. The write circuit 16 uses the voltages from the voltage generator 171 to thereby pass the write current through the selected memory cell MC to thereby write specified data. The input and output circuit 14 transmits write data input from the outside to the write circuit 16, and outputs read data from the read circuit 15 outside.

FIG. 7 is a circuit diagram of the read circuit 15. FIG. 7 also illustrates a read-target memory cell MC coupled to the read circuit by selection thereof as well as the read circuit 15. The selected memory cell MC is illustrated representatively by the element MTJ. As illustrated in FIG. 7, the selection of the read-target memory cell MC (or, element MTJ) results in nodes N1 and N2 of that element MTJ being coupled to the bit lines BL and /BL of the column to which that element MTJ belongs, respectively.

A power supply node is coupled to the nodes N1 and N2 via p-type MOSFETs TP1 and TP2, respectively. A p-type MOSFET is turned on when it receives a low potential (L level) at the gate. The power supply node has the power supply potential. The gate of the transistor TP1 is coupled to the node N2. The gate of the transistor TP2 is coupled to the node N1. The node N1 is also coupled to a ground node via an n-type MOSFET TN1. An n-type MOSFET is turned on when it receives a high potential (H level) at the gate, and therefore the transistor TN1 is turned on when it receives a potential higher than the potential which turns on the transistors TP1 and TP2. The ground node has the ground potential. The gate of the transistor TN1 is coupled to the node N2. The node N2 is also coupled to the ground node via the resistance element R1.

Applying the nodes N1 and N2 with suitable voltages can pass the current Iw into the element MTJ. For example, when the current IwAP flows through the element MTJ from the right to the left of FIG. 4, the element MTJ takes the high resistance state. In contrast, when the current IwP flows through the element MTJ from the left to the right, the element MTJ takes the low resistance state.

Figure 8:
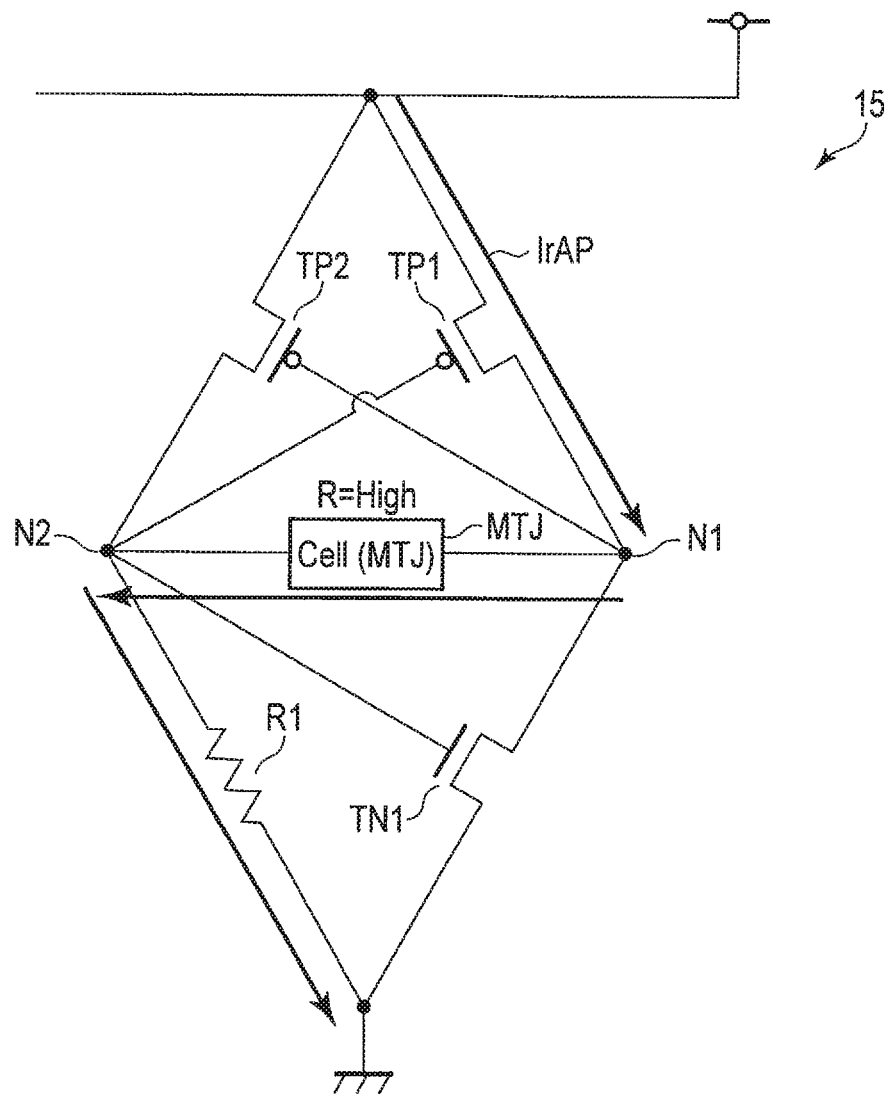
FIG. 8 illustrates a path of a current flowing in a state of the read circuit of the first embodiment.
Figure 9:
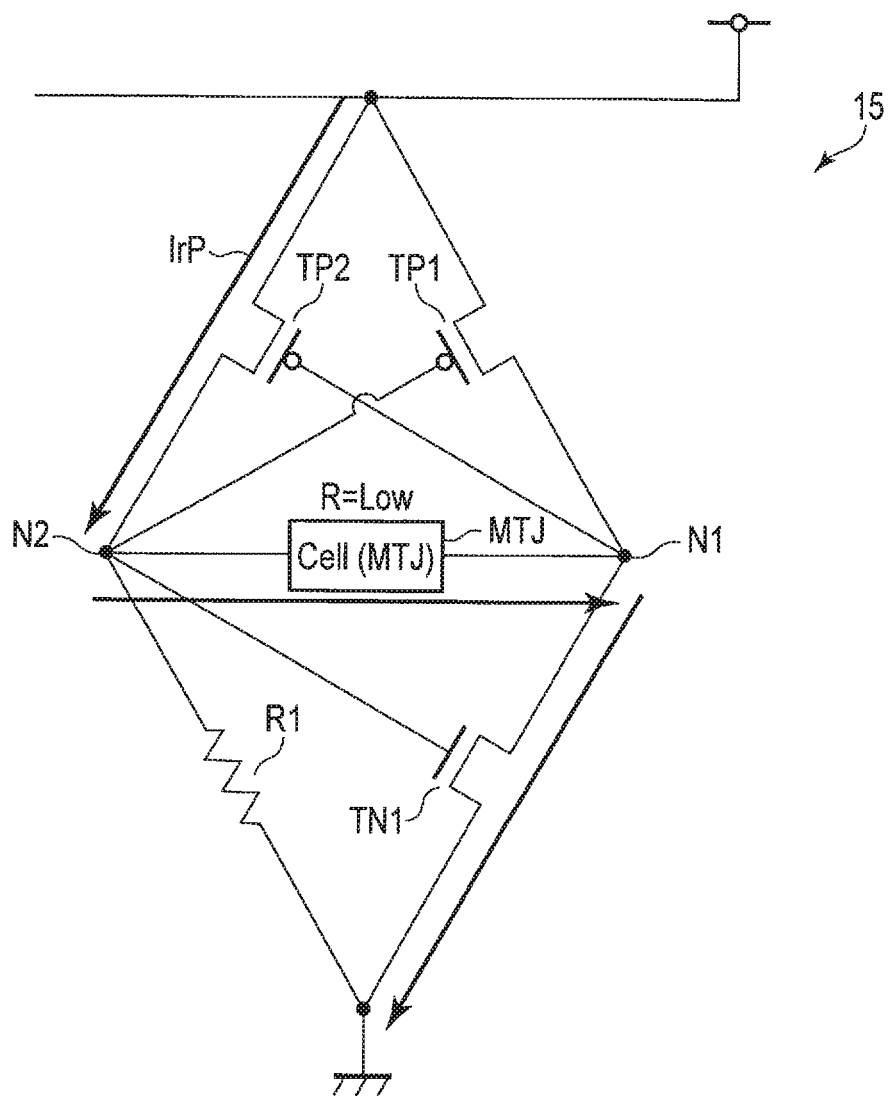
FIG. 9 illustrates a path of a current flowing in another state of the read circuit of the first embodiment.

The operation of the memory cell and read circuit of FIG. 4 will now be described with reference to FIGS. 8 and 9. FIGS. 8 and 9 illustrate paths taken by a read current Ir when the element MTJ of the memory cell MC of the first embodiment is in the high resistance and low resistance state, respectively.

The controller 17 maintains the nodes N1 and N2 at the same (in actuality, substantially the same) potential through the voltage generator 171 in a state during which the memory cell MC is not accessed. In order for data to be read from the memory cell MC, the controller 17 lifts the maintenance of the nodes N1 and N2 at the same potential through the voltage generator 171, and then generates a difference in potential between the nodes N1 and N2. Any of nodes N1 and N2 can be set to the high potential. Which node is set to the high potential is predetermined, for example. For example, also for a case of multiple memory cells MC being provided, the same one of nodes is set to the high potential in every memory cell MC. The following description is based on an example with the potential of the node N1 being higher than that of the node N2.

With a potential difference given between the nodes N1 and N2 from the outside, the read circuit 15 shifts to a transition state from a non-accessed state. This applied voltage from the outside is hereinafter referred to as a read initial voltage. While the read initial voltage is being applied, a current flows through the element MTJ from the node N1 to the node N2. After the generation of the potential difference, the controller 17 stops the application of the voltages to the nodes N1 and N2. When the voltage application to the nodes N1 and N2 finishes, the read circuit 15 shifts to a static state of FIG. 8 or that of FIG. 9 autonomously after a lapse of a fixed time from the end in accordance with the state of the element MTJ.

With the element MTJ in the high resistance state, the read circuit 15 shifts from the transition state to the static state of FIG. 8. Since the element MTJ has the high resistance, the ratio of voltage division between the element MTJ and resistance element R1 is large, and therefore the potential of the node N2 is low. With the low potential node N2, the transistor TP1 is turned on and the potential of the power supply node is transmitted to the node N1. Moreover, with the low potential node N2, the transistor TN1 is turned off. Therefore, the node N1 receives the potential of the power supply node and is disconnected from the ground node and becomes the high potential. With the high potential node N1, the transistor TP2 is turned off. With such states of the transistor TP1, TP2, and TN1, the read current IrAP flows through the element MTJ from the node N1 to the node N2. The direction of the read current IrAP is the same as that of the write current IwAP for setting the element MTJ to the high resistance state. The data signal based on the potential of the bit-line pair BL and /BL in the static state is used as read data.

In contrast, with the element MTJ in the low resistance state, the read circuit 15 shifts from the transition state to the static state of FIG. 9. At the time of the start of the transition state, the potential of the node N1 is higher than that of the node N2 because of the application of the voltages from the outside as described above. However, unlike the FIG. 8 case, the potential of the node N2 rises with the end of the transition state because the ratio of voltage division between the element MTJ and the resistance element R1 is small. With the potential rise of the node N2, the transistor TP1 is turned off whereas the transistor TN1 is turned on. This causes a further drop of the potential of the node N1, and the low potential node N1 turns off the transistor TP2. With such states of the transistors TP1, TP2, and TN1, the read current IrP flows through the element MTJ from the node N2 to the node N1. The direction of the read current IrP is the same as that of the write current IwP for setting the element MTJ to the low resistance state.

Figure 10:
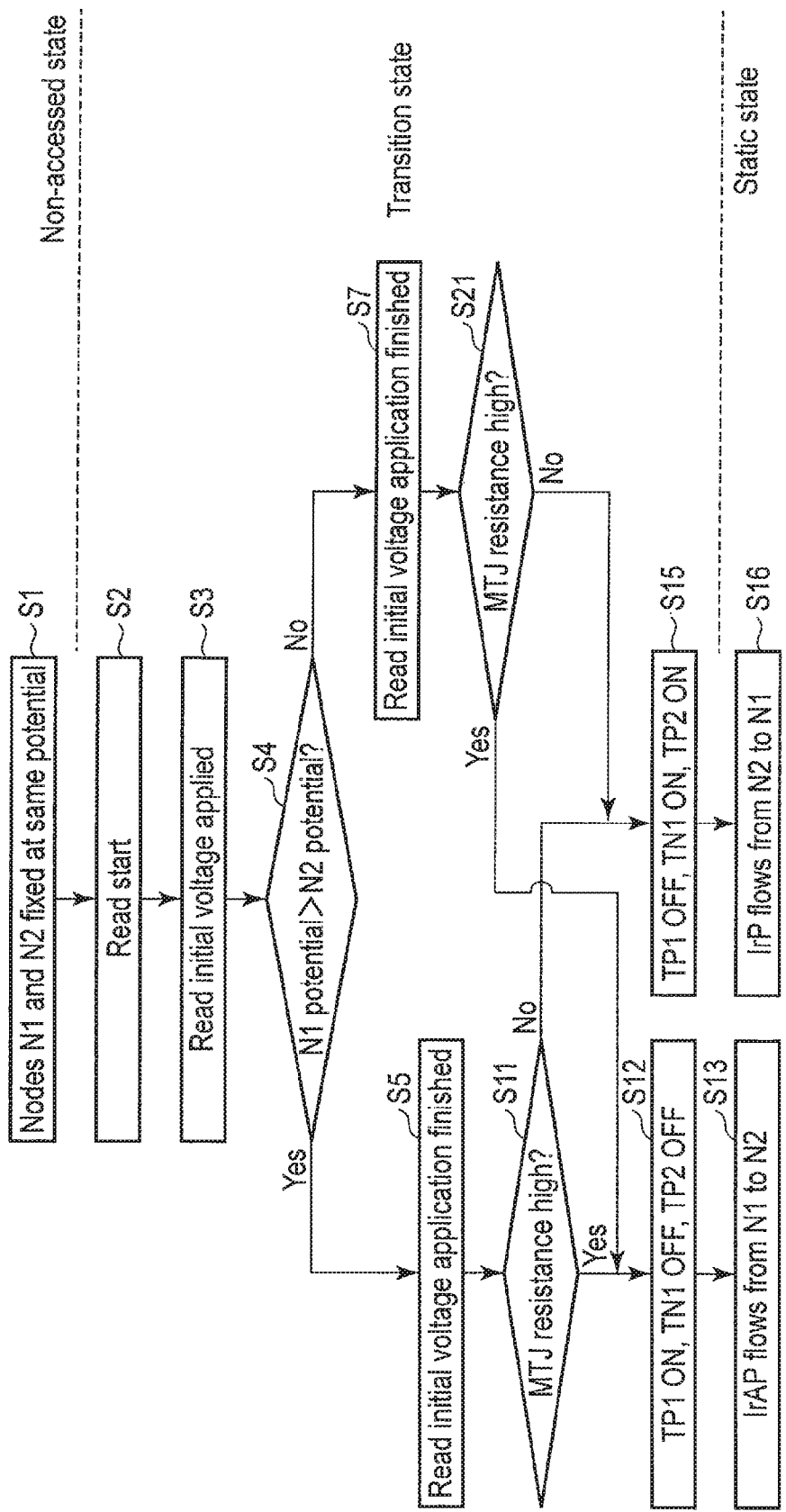
FIG. 10 illustrates the flow of the read of the first embodiment.

Such a read is represented by the flow of FIG. 10, which illustrates the flow of the read of the first embodiment. The description so far is based on an example of the read initial voltage having the potential at the node N1 higher than that of the node N2. In contrast, the FIG. 10 flow also covers an example of the read initial voltage with the opposite direction.

Prior to the start of the read, the read circuit 15 is in the non-accessed state (step S1). In the non-accessed state, the controller 17 maintains the nodes N1 and N2 at the same potential. Selection of a memory cell MC triggers a read from the selected memory cell MC (step S2). The controller 17 then lifts the application of the same potential to the nodes N1 and N2, and applies the read initial voltage (step S3). The application of the read initial voltage shifts the read circuit 15 from the non-accessed state to the transition state.

When the read initial voltage has a potential at the node N1 higher than that at the node N2, the flow shifts from step S4 to step S5. In step S5, the controller 17 finishes the application of the read initial voltage.

After the end of the application of the read initial voltage, when the resistance of the element MTJ of the read-target memory cell MC is high, the flow shifts from step S11 to step S12. In step S12, the read circuit 15 shifts to a state where the transistors TP1, TN1, and TP2 are on, off, and on, respectively, as described with reference to FIG. 8. The settlement of the states of the transistors TP1, TN1, and TP2 finishes the transition state of the read circuit 15. In accordance with the states of the transistors reached at step S12, the read current Ir (IrAP) flows from the node N1 to the node N2 (step S13).

In contrast, when the resistance of the MTJ of the read-target memory cell is low, the flow shifts from step S11 to step S15. In step S15, the read circuit 15 shifts to a state where the transistors TP1, TN1, and TP2 are off, on, and on, respectively, as described with reference to FIG. 9. The settlement of the states of the transistors TP1, TN1, and TP2 finishes the transition state of the read circuit 15. In accordance with the states of the transistors reached at step S15, the read current Ir (IrP) flows from the node N2 to the node N1 (step S16).

When the read initial voltage has a potential at the node N2 higher than that of the node N1, the flow shifts from step S4 to step S7. In step S7, the controller 17 finishes the application of the read initial voltage.

After the end of the application of the read initial voltage, when the element MTJ of the read-target memory cell MC is in the high resistance state, the flow shifts from step S21 to step S12. In contrast, when the MTJ of the read-target memory cell is in the low resistance state, the flow shifts from step S21 to step S15.

As described above, according to the first embodiment, the direction in which the current Ir (IrAP and IrP) flows is autonomously determined in accordance with the state of the element MTJ, and the determined direction of flow of the read current Ir is the same as the direction in which the write current Iw (IwAP and IwP) flows to obtain the present state of the element MTJ. This eliminates a possibility of occurrence of the read disturb, and hence abolishes the necessity to secure the margin of distributions of the currents IrP and Ic for avoiding the read disturb. To be more precise, this means acceptance of the overlap of distributions of the currents IrP and Ic as in FIG. 4, and makes it possible to place the distributions of various kinds of currents in a range narrower than in the FIG. 3 example. Therefore, narrowing a range over which current distributions for normal operation spread results in a decreased maximum required current, which in turn can realize a magnetoresistive memory device with both normal operation and low current consumption.

Second Embodiment

The second embodiment differs from the first embodiment, in the configuration of the read circuit 15.

Figure 11:
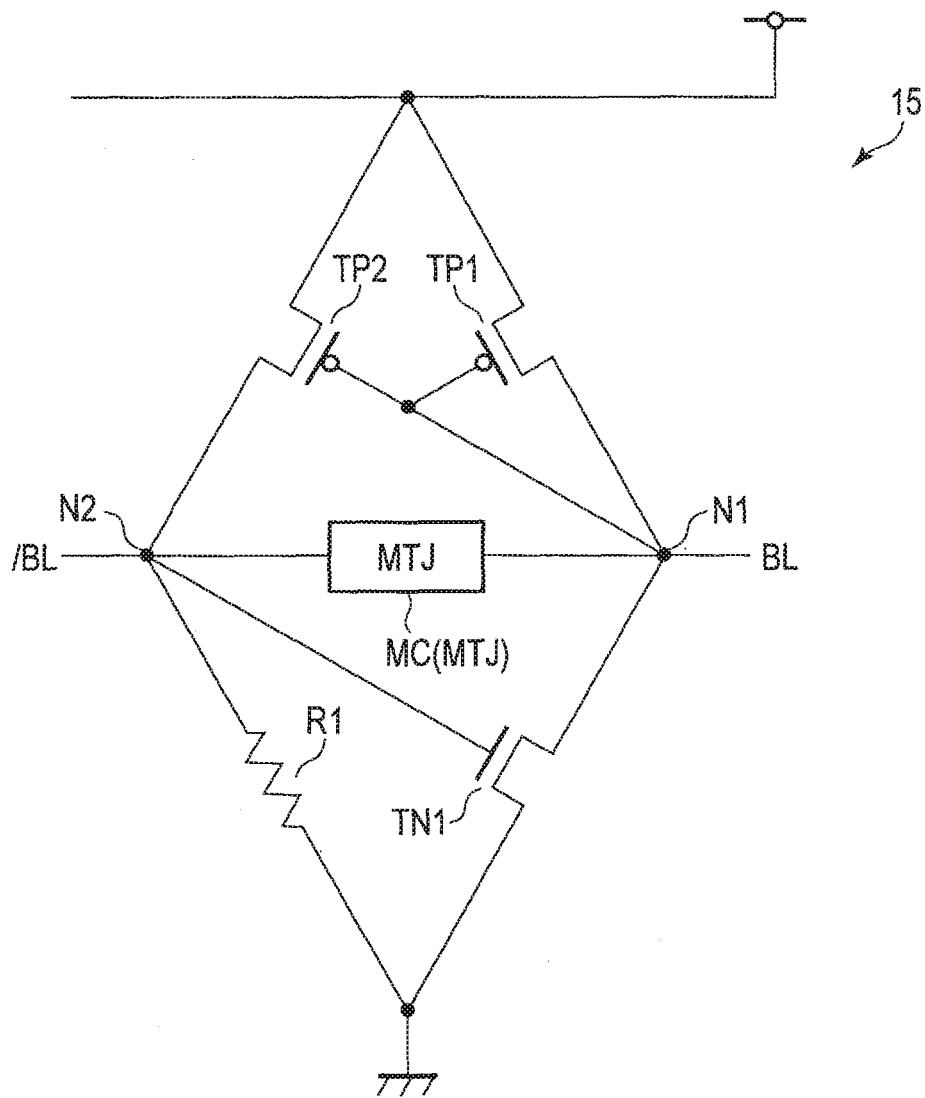
FIG. 11 illustrates a circuit diagram of a read circuit of a second embodiment.

FIG. 11 is the circuit diagram of the read circuit 15 of the second embodiment. In the second embodiment, the gate of the transistor TP1 is coupled to the node N1 as illustrated in FIG. 11. This contrasts to the first embodiment where the gate of the transistor TP1 is coupled to the node N2.

The read circuit 15 of the second embodiment operates similarly to the read circuit 15 of the first embodiment from the start of the application of the read initial voltage up to flow of the read current. In contrast, in the second embodiment, the read circuit 15 can operate with only in a fixed direction of the read initial voltage. Specifically, the read initial voltage must be higher at the node N1 than at the node N2. It does not operate with the voltage of the opposite direction. On the other hand, with the direction of the read initial voltage fixed, a time spent for the transition state of the read circuit 15 is shorter than that in the first embodiment. This is because the read circuit 15 needs to go through two stages; i.e., the detection of the direction of the read initial voltage and the detection of the state of the element MTJ in the first embodiment, whereas the direction of the read initial voltage does not need to be detected in the second embodiment.

As described above, according to the second embodiment, the direction in which the current Ir (IrAP and IrP) flows is autonomously determined in accordance with the state of the element MTJ, and the determined direction of flow of the read current Ir is the same as the direction in which the write current Iw (IwAP and IwP) flows to obtain the present state of the element MTJ as in the first embodiment. This can produce the same advantages as the first embodiment. Furthermore, according to the second embodiment, the time spent for the transition state of the read circuit 15 is short, and therefore the total time for read is also short.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a variable resistance element comprising a first magnetic layer, a second magnetic layer, and a nonmagnetic layer between the first and second magnetic layers, the variable resistance element having a resistance state, the resistance state being one of switchable first and second resistance states, the first and second resistance states exhibiting different resistances, and each of the first and second resistance states being reached by a current flowing through the first magnetic layer, the second magnetic layer, and the nonmagnetic layer in one of opposing first and second directions; and
a read circuit which passes a read current through the first magnetic layer, the second magnetic layer, and the nonmagnetic layer autonomously in the first or second direction in accordance with the resistance state of the variable resistance element.

2. The device of claim 1, wherein:
a write current of the first direction and a write current of the second direction set the variable resistance element to the first and second resistance states, respectively, and
the read circuit:
passes the read current in the first direction when the variable resistance element is in the first resistance state, and
passes the read current in the second direction when the variable resistance element is in the second resistance state.

3. The device of claim 2, wherein the read circuit comprises:
a first switch that is coupled between a power supply node and a first node of the variable resistance element and is turned on upon reception of a first potential;
a second switch that is coupled between the power supply node and a second node of the variable resistance element and is turned on upon reception of a second potential;

a third switch that is coupled between the first node of the variable resistance element and a ground node and is turned on upon reception of a third potential higher than any of the first potential and the second potential; and a resistance element coupled between the second node of the variable resistance element and the ground node.

4. The device of claim 3, wherein:
the first switch comprises a p-type metal oxide semiconductor field effect transistor (MOSFET) coupled to the second node of the variable resistance element at a gate,
the second switch comprises a p-type MOSFET coupled to the first node of the variable resistance element at a gate, and
the third switch comprises an n-type MOSFET coupled to the second node of the variable resistance element at a gate.

5. The device of claim 4, wherein the read circuit:
receives substantially the same potential at the first and second nodes while the variable resistance element is not accessed, and
receives different potentials at the first and second nodes when the variable resistance element is accessed for read.

6. The device of claim 5, wherein the read circuit autonomously passes the read current through the first magnetic layer, the second magnetic layer, and the nonmagnetic layer in the first or second direction after completion of reception of the potentials different between the first and second nodes.

7. The device of claim 1, wherein the resistance state of the variable resistance element is based on a state of magnetization of the variable resistance element.

8. The device of claim 1, wherein the variable resistance element has the first or second resistance state in accordance with a combination of orientations of magnetization of the first magnetic layer and magnetization of the second magnetic layer.

9. The device of claim 3, wherein:
the first switch comprises a p-type metal oxide semiconductor field effect transistor (MOSFET) coupled to the first node of the variable resistance element at a gate,
the second switch comprises a p-type MOSFET coupled to the first node of the variable resistance element at a gate, and
the third switch comprises an n-type MOSFET coupled to the second node of the variable resistance element at a gate.

10. The device of claim 9, wherein the read circuit:
receives substantially the same potential at the first and second nodes while the variable resistance element is not accessed, and
receives different potentials at the first and second nodes when the variable resistance element is accessed for read.

11. The device of claim 10, wherein the read circuit autonomously passes the read current through the first magnetic layer, the second magnetic layer, and the nonmagnetic layer in the first or second direction after completion of reception of the potentials different between the first and second nodes.

12. A magnetoresistive memory device comprising:
a variable resistance element having a resistance state, the resistance state being one of switchable first and second resistance states, the first and second resistance states exhibiting different resistances, and each of the first and second resistance states being reached by a current flowing through the variable resistance element in one of opposing first and second directions; and a read circuit which passes a read current to the variable resistance element, wherein the read circuit comprises:
a first switch that is coupled between a power supply node and a first node of the variable resistance element and is turned on upon reception of a first potential,
a second switch that is coupled between the power supply node and a second node of the variable resistance element and is turned on upon reception of a second potential,
a third switch that is coupled between the first node of the variable resistance element and a ground node and is turned on upon reception of a third potential higher than any of the first potential and the second potential, and
a resistance element coupled between the second node of the variable resistance element and the ground node.

13. The device of claim 12, wherein:
the first switch comprises a p-type metal oxide semiconductor field effect transistor (MOSFET) coupled to the second node of the variable resistance element at a gate,
the second switch comprises a p-type MOSFET coupled to the first node of the variable resistance element at a gate, and
the third switch comprises an n-type MOSFET coupled to the second node of the variable resistance element at a gate.

14. The device of claim 12, wherein:
the first switch comprises a p-type metal oxide semiconductor field effect transistor (MOSFET) coupled to the first node of the variable resistance element at a gate,
the second switch comprises a p-type MOSFET coupled to the first node of the variable resistance element at a gate, and
the third switch comprises an n-type MOSFET coupled to the second node of the variable resistance element at a gate.

15. The device of claim 12, wherein the variable resistance element comprises a first magnetic layer, a second magnetic layer, and a nonmagnetic layer between the first and second magnetic layers.

16. A magnetoresistive memory device comprising:
a variable resistance element;
a first switch that is coupled between a power supply node and a first node of the variable resistance element and is turned on upon reception of a first potential;
a second switch that is coupled between the power supply node and a second node of the variable resistance element and is turned on upon reception of a second potential;
a third switch that is coupled between the first node of the variable resistance element and a ground node and is turned on upon reception of a third potential; and
a resistance element coupled between the second node of the variable resistance element and the ground node.

17. The device of claim 16, wherein the third potential is higher than any of the first potential and the second potential.

18. The device of claim 16, wherein:
the first switch comprises a p-type metal oxide semiconductor field effect transistor (MOSFET) coupled to the second node of the variable resistance element at a gate, the second switch comprises a p-type MOSFET coupled to the first node of the variable resistance element at a gate, and the third switch comprises an n-type MOSFET coupled to the second node of the variable resistance element at a gate.

19. The device of claim 16, wherein:

the first switch comprises a p-type metal oxide semiconductor field effect transistor (MOSFET) coupled to the first node of the variable resistance element at a gate, the second switch comprises a p-type MOSFET coupled to the first node of the variable resistance element at a gate, and the third switch comprises an n-type MOSFET coupled to the second node of the variable resistance element at a gate.

20. The device of claim 16, wherein the variable resistance element comprises a first magnetic layer, a second magnetic layer, and a nonmagnetic layer between the first and second magnetic layers.

* * * * *